United States Patent
Mittal et al.

(10) Patent No.: US 10,630,239 B1
(45) Date of Patent: Apr. 21, 2020

(54) LOW AREA LAYOUT FOR MULTIPHASE MIXER LOCAL OSCILLATOR

(71) Applicant: QUALCOMM Incorporated, San Diego, CA (US)

(72) Inventors: Ayush Mittal, Bangalore (IN); Gajanan Maroti Devpuje, Munnekolala (IN); Krishnaswamy Thiagarajan, Bangalore (IN); Bhushan Shanti Asuri, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 16/439,574

(22) Filed: Jun. 12, 2019

(51) Int. Cl.
*H03K 5/15* (2006.01)
*G06F 1/04* (2006.01)
*H03D 7/12* (2006.01)
*H03K 3/017* (2006.01)
*H03K 19/20* (2006.01)

(52) U.S. Cl.
CPC ............ *H03D 7/12* (2013.01); *H03K 3/017* (2013.01); *H03K 19/20* (2013.01)

(58) Field of Classification Search
CPC ........... H03D 7/12; H03K 3/017; H03K 19/20
See application file for complete search history.

(56) References Cited

U.S. PATENT DOCUMENTS

| | | | |
|---|---|---|---|
| 7,800,965 B2* | 9/2010 | Juengling | G11C 11/4094 365/202 |
| 7,904,050 B2* | 3/2011 | Smentek | H04B 1/26 455/17 |
| 8,503,964 B2* | 8/2013 | Herder | H03D 7/1441 455/310 |
| 8,667,043 B2* | 3/2014 | Wiencke | G06F 7/5306 708/626 |
| 9,385,657 B1* | 7/2016 | Daftari | H03D 7/1441 |

* cited by examiner

*Primary Examiner* — Kenneth B Wells
(74) *Attorney, Agent, or Firm* — Loza & Loza, LLP

(57) ABSTRACT

In certain aspects, an apparatus includes a plurality of phase generators configured to generate a first plurality of local oscillator (LO) phase signals, wherein the plurality of phase generators includes a first set of phase generators and a second set of phase generators. The apparatus also includes a duty cycle generator coupled to the plurality of phase generators, wherein the duty cycle generator is configured to receive the first plurality of LO phase signals and to generate a second plurality of LO phase signals by converting a duty cycle of each of the first plurality of LO phase signals. The first set of phase generators is located adjacent to a first side of the duty cycle generator and the second set of phase generators is located adjacent to a second side of the duty cycle generator, the second side being opposite the first side.

23 Claims, 9 Drawing Sheets

US 10,630,239 B1

LOW AREA LAYOUT FOR MULTIPHASE MIXER LOCAL OSCILLATOR

BACKGROUND

Field

Aspects of the present disclosure relate generally to mixers, and more particularly, to layouts for multiphase mixers.

Background

Mixers are used in wireless devices for frequency translation. For example, one or more mixers may be used to frequency up-convert a baseband signal to a radio frequency (RF) signal for transmission, and one or more mixers may be used to frequency down-convert a received RF signal to a baseband signal for baseband processing. A mixer translates the frequency of a signal (e.g., baseband signal, RF signal, etc.) by mixing the signal with a local oscillator (LO) signal.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to an apparatus. The apparatus includes a plurality of phase generators configured to generate a first plurality of local oscillator (LO) phase signals, wherein the plurality of phase generators includes a first set of phase generators and a second set of phase generators. The apparatus also includes a duty cycle generator coupled to the plurality of phase generators, wherein the duty cycle generator is configured to receive the first plurality of LO phase signals and to generate a second plurality of LO phase signals by converting a duty cycle of each of the first plurality of LO phase signals. The first set of phase generators is located adjacent to a first side of the duty cycle generator and the second set of phase generators is located adjacent to a second side of the duty cycle generator, the second side being opposite the first side. A second aspect relates to an apparatus for multiphase local oscillation. The apparatus includes means for generating a plurality of local oscillator (LO) phase signals, the plurality of LO signals including a first set of LO phase signals and a second set of LO phase signals. The apparatus also includes means for converting a duty cycle of each of the plurality of LO phase signals. The means for converting receives the first set of LO phase signals on a first side of the means for converting, and receives the second set of LO phase signals on a second side of the means for converting, the second side being opposite the first side.

A third aspect relates to a method for multiphase local oscillation. The method includes generating a plurality of local oscillator (LO) phase signals, the plurality of LO signals including a first set of LO phase signals and a second set of LO phase signals. The method also includes receiving the first set of LO phase signals on a first side of a duty cycle generator, receiving the second set of LO phase signals on a second side of the duty cycle generator, the second side being opposite the first side, and converting a duty cycle of each of the plurality of LO phase signals using the duty cycle generator.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the described implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

A mixer may be used in a wireless device (e.g., a cellular phone, a base station, a wireless access point, etc.) to translate the frequency of a signal (e.g., baseband signal, RF signal, etc.) by mixing the signal with a local oscillator (LO) signal. For example, the mixer may mix a baseband signal with the LO signal to frequency up-convert the baseband signal to an RF signal for transmission to another wireless device, or mix an RF signal received from another wireless device with the LO signal to frequency down-convert the RF signal to a baseband signal for baseband processing.

One type of mixer used for frequency translation is a switching mixer, which mixes the signal being frequency translated with a square-wave LO signal. A problem with switching mixers is that they generate undesirable harmonics (e.g., third order harmonics, fifth order harmonics, etc.). To suppress the harmonics, multiphase harmonic-rejection mixers (HRMs) may be used. A multiphase HRM may suppress harmonics by using multiple phases of a square-wave LO signal to generate a quantized sinusoidal waveform that approximates an ideal sinusoidal waveform. To do this, the multiphase HRM may mix the signal being frequency translated with the multiple phases of the square-wave LO signal using multiple switching mixers (also referred to as sub-mixers), and combine the output signals of the switching mixers to generate the output signal of the multiphase HRM.

Figure 1:
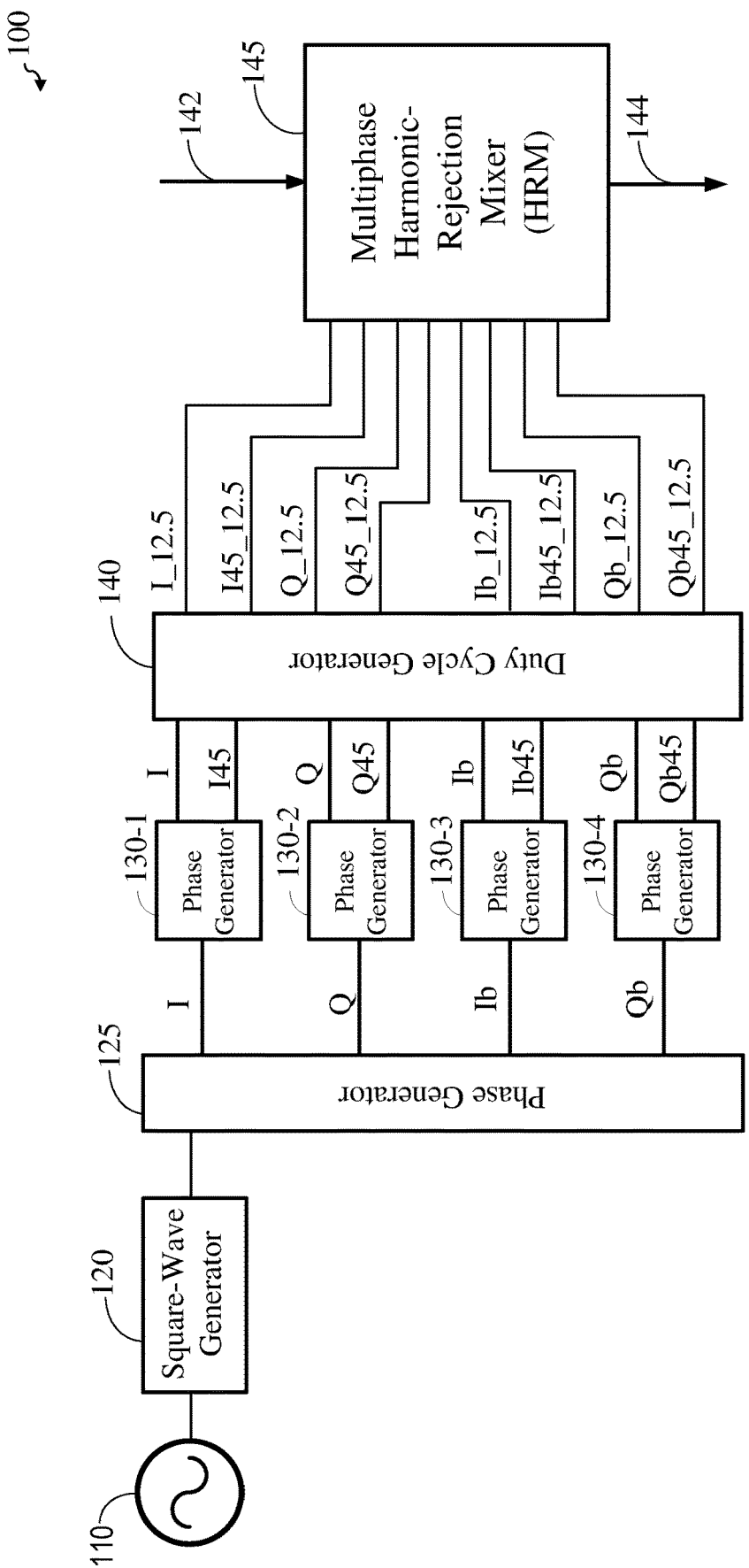
FIG. 1 shows an example of a system including phase generators, a duty cycle generator, and a multiphase harmonic-rejection mixer (HRM) according to certain aspects of the present disclosure.

FIG. 1 shows an example of a system 100 including a local oscillator 110, a square-wave generator 120, phase generators 125 and 130-1 to 130-4, a duty cycle generator 140, and a multiphase harmonic-rejection mixer (HRM) 145 according to certain aspects of the present disclosure. The system 100 may be included in a wireless device (e.g., a cellular phone, a base station, a wireless access point, etc.) that supports one or more radio technologies for wireless communication such as 5G, LTE, CDMA2000, WCDMA, TD-SCDMA, GSM, IEEE 802.11, etc. In certain aspects, the system 100 may be integrated on a die (i.e., chip).

In the example in FIG. 1, the multiphase HRM 145 is an 8-phase HRM configured to receive eight phases of a square-wave LO signal, where each phase has a duty cycle of 12.5%. The multiphase HRM 145 mixes an input signal 142 (e.g., baseband signal) with the eight phases of the LO signal using multiple sub-mixers (not shown) and combines the output signals of the sub-mixers to generate an output signal 144. Each of the multiple sub-mixers may be a switching mixer. The output signal 144 (e.g., RF signal) is a frequency translated version of the input signal 142. In this example, the multiphase HRM 145 suppresses (i.e., reduces) third and fifth order harmonics. The multiphase HRM 145 may be used, for example, in a transmitter to up-convert the frequency of the input signal 142 from baseband to RF for transmission or from baseband to an intermediate frequency. In another example, the multiphase HRM 145 may be used in a receiver to down-convert the frequency of the input signal 142 from RF to baseband or from an intermediate frequency to baseband. The input signal 142 may be a complex signal including in-phase (I) and quadrature (Q) components, and the output signal 144 may be a complex signal including I and Q components.

The local oscillator 110, the square-wave generator 120, the phase generators 125 and 130-1 to 130-4, and the duty cycle generator 140 generate the eight phases of the LO signal for the multiphase HRM 145, as discussed further below. The local oscillator 110 is configured to generate a sinusoidal LO signal, and may be implemented with a voltage-controlled oscillator or another type of oscillator. The square-wave generator 120 converts the sinusoidal LO signal from the local oscillator 110 into the square-wave LO signal, and outputs the square-wave LO signal to the phase generator 125.

The phase generator 125 generates four phases of the square-wave LO signal. More particularly, the phase generator 125 converts the square-wave LO signal into four LO phase signals (labeled "I" to "Qb") having the same frequency but different phases. The phases of the four LO phase signals I to Qb are spaced approximately 90 degrees apart from each other. In this example, LO phase signal Q is 90 degrees out of phase with LO phase signal I, LO phase signal Ib is 180 degrees out of phase with LO phase signal I, and LO phase signal Qb is 270 degrees out of phase with LO phase signal I.

The phase generators 130-1 to 130-4 receive the four LO phase signals I to Qb from the phase generator 125 and output eight LO phase signals (labeled "I" to "Qb45") having the same frequency and spaced approximately 45 degrees apart in phase from each other. More particularly, LO phase signal I45 is 45 degrees out of phase with LO phase signal I, LO phase signal Q45 is 45 degrees out of phase with LO phase signal Q, LO phase signal Ib45 is 45 degrees out of phase with LO phase signal Ib, and LO phase signal Qb45 is 45 degrees out of phase with LO phase signal Qb. The LO phase signals I to Qb45 may be different phase-shifted versions of the square-wave LO signal.

The duty cycle generator 140 receives the eight LO phase signals I to Qb45 from the phase generators 130-1 to 130-4. The duty cycle generator 140 converts the duty cycle of each of the eight LO phase signals I to Qb45 to a duty cycle of 12.5% to generate LO phase signals I_12.5 to Qb45_12.5. The LO phase signals I_12.5 to Qb45_12.5 have the same frequency and are spaced approximately 45 degrees apart in phase. Each of the LO phase signals I_12.5 to Qb45_12.5 has a duty cycle of approximately 12.5%. The LO phase signals I_12.5 to Qb45_12.5 are output to the multiphase HRM 145 and provide the multiphase HRM 145 with the eight phases of the square-wave LO signal discussed above.

The length of the signal routing from the duty cycle generator 140 to the multiphase HRM 145 for each of the LO phase signals I_12.5 to Qb45_12.5 may be approximately the same to preserve the phase relationships between the LO phase signals I_12.5 to Qb45_12.5 at the HRM 145. This helps ensure that the LO phase signals I_12.5 to Qb45_12.5 are spaced approximately 45 degrees apart at the multiphase HRM 145.

Figure 2:
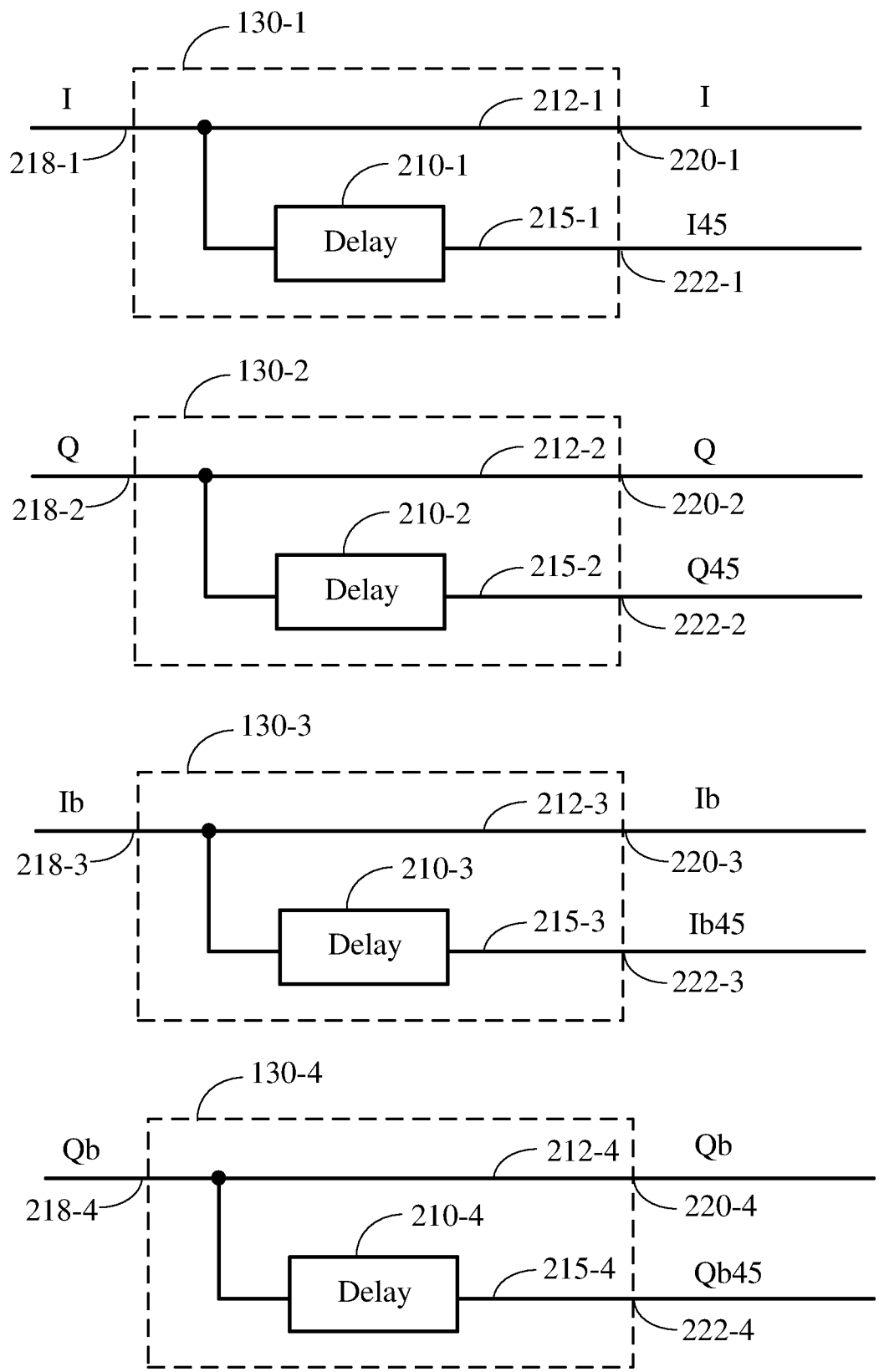
FIG. 2 shows an exemplary implementation of phase generators according to certain aspects of the present disclosure.

FIG. 2 shows an exemplary implementation of the phase generators 130-1 to 130-4 according to certain aspects of the present disclosure.

In this example, the phase generator 130-1 includes a first signal line 212-1 and a second signal line 215-1. The first signal line 212-1 is coupled between the input 218-1 of the phase generator 130-1 and a first output 220-1 of the phase generator 130-1, and the second signal line 215-1 is coupled between the input 218-1 of the phase generator 130-1 and a second output 222-1 of the phase generator 130-1. The phase generator 130-1 is configured to receive the LO phase signal I at the input 218-1, output the LO phase signal I at the first output 220-1, and output the LO phase signal I45 at the second output 222-1. The phase generator 130-1 includes a delay element 210-1 in the second signal line 215-1 configured to delay the LO phase signal I by approximately one-eighth of a cycle (i.e., period) of the LO phase signal I to generate the LO phase signal I45. The one-eighth cycle delay corresponds to a phase shift of approximately 45 degrees. Thus, in this example, the phase generator 130-1 generates the LO phase signal I45 by delaying the LO phase signal I in the second signal line 215-1 by approximately one-eighth of a cycle with respect to the LO phase signal I in the first signal line 212-1.

The phase generator 130-2 includes a first signal line 212-2 and a second signal line 215-2. The first signal line 212-2 is coupled between the input 218-2 of the phase generator 130-2 and a first output 220-2 of the phase generator 130-2, and the second signal line 215-2 is coupled between the input 218-2 of the phase generator 130-2 and a second output 222-2 of the phase generator 130-2. The phase generator 130-2 is configured to receive the LO phase signal Q at the input 218-2, output the LO phase signal Q at the first output 220-2, and output the LO phase signal Q45 at the second output 222-2. The phase generator 130-2 includes a delay element 210-2 in the second signal line 215-2 configured to delay the LO phase signal Q by approximately one-eighth of a cycle (i.e., period) of the LO phase signal Q to generate the LO phase signal Q45.

The phase generator 130-3 includes a first signal line 212-3 and a second signal line 215-3. The first signal line 212-3 is coupled between the input 218-3 of the phase generator 130-3 and a first output 220-3 of the phase generator 130-3, and the second signal line 215-3 is coupled between the input 218-3 of the phase generator 130-3 and a second output 222-3 of the phase generator 130-3. The phase generator 130-3 is configured to receive the LO phase signal Ib at the input 218-3, output the LO phase signal Ib at the first output 220-3, and output the LO phase signal Ib45 at the second output 222-3. The phase generator 130-3 includes a delay element 210-3 in the second signal line 215-3 configured to delay the LO phase signal Ib by approximately one-eighth of a cycle (i.e., period) of the LO phase signal Ib to generate the LO phase signal Ib45.

The phase generator 130-4 includes a first signal line 212-4 and a second signal line 215-4. The first signal line 212-4 is coupled between the input 218-4 of the phase generator 130-4 and a first output 220-4 of the phase generator 130-4, and the second signal line 215-4 is coupled between the input 218-4 of the phase generator 130-4 and a second output 222-4 of the phase generator 130-4. The phase generator 130-4 is configured to receive the LO phase signal Qb at the input 218-4, output the LO phase signal Qb at the first output 220-4, and output the LO phase signal Qb45 at the second output 222-4. The phase generator 130-4 includes a delay element 210-4 in the second signal line 215-4 configured to delay the LO phase signal Qb by approximately one-eighth of a cycle (i.e., period) of the LO phase signal Qb to generate the LO phase signal Qb45.

The delay elements 210-1 to 210-4 may be implemented with delay locked loops (DLLs) or other types of delay elements. The lengths of the first signal lines 212-1 to 212-4 may be approximately the same to preserve the phase relationships between the LO phase signals I, Q, Ib and Qb. The signal lines 212-1 to 212-4 and 215-1 to 215-4 may be implemented with metal lines (also referred to as metal traces) on the die. The second signal lines 215-1 to 215-4 may also be referred to as delay lines since each of the second signal lines 215-1 to 215-4 includes a respective delay element. It is to be appreciated that the phase generators 130-1 to 130-4 are not limited to the exemplary implementation shown in FIG. 2. For example, the phase generators 130-1 to 130-4 may generate the LO phase signals I45, Q45, Ib45 and Qb45 using phase shifters in place of or in combination with delay lines.

Figure 3:
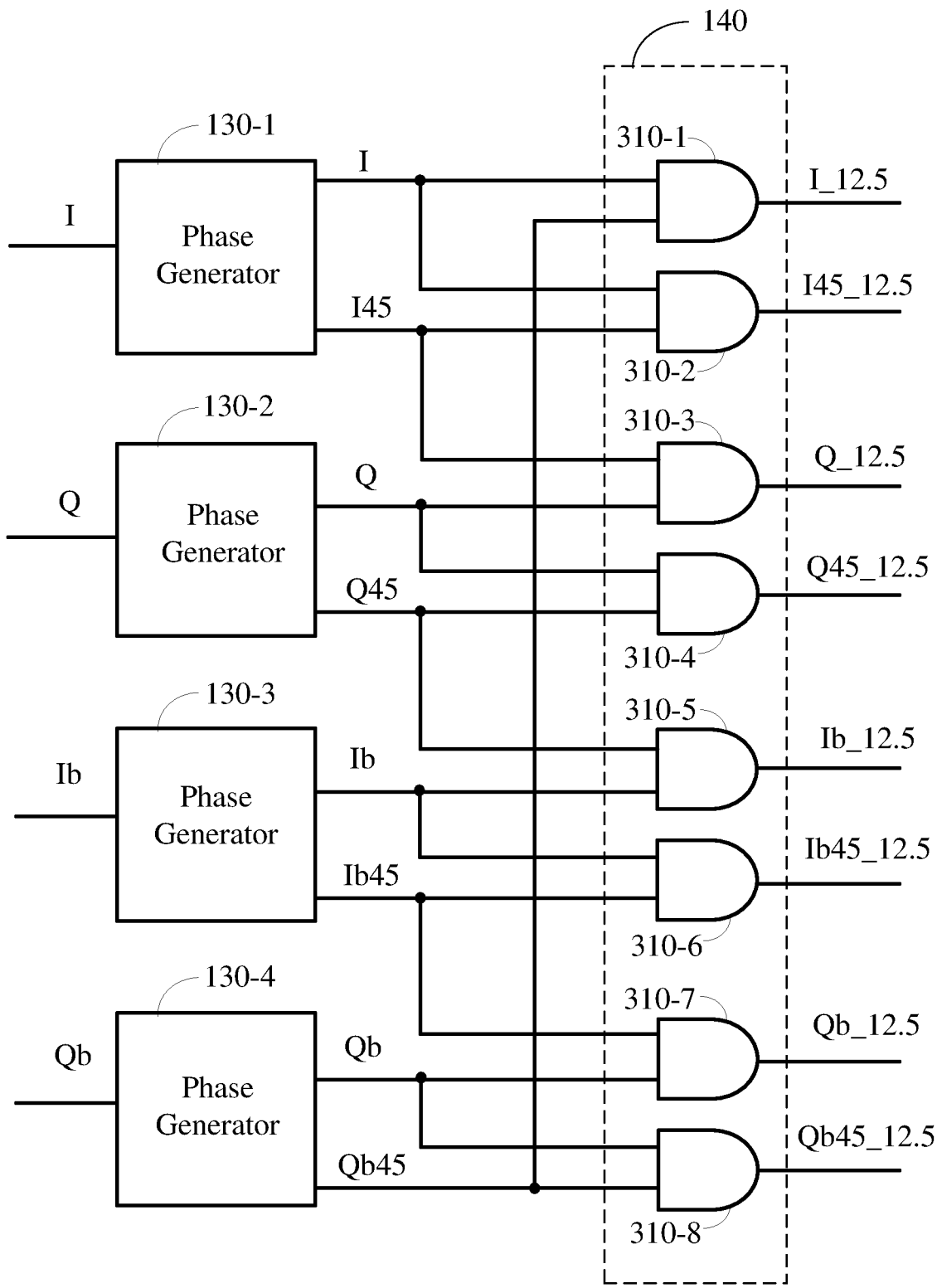
FIG. 3 shows an exemplary implementation of a duty cycle generator according to certain aspects of the present disclosure.

FIG. 3 shows an exemplary implementation of the duty cycle generator 140 according to certain aspects of the present disclosure. In this example, the duty cycle generator 140 includes multiple AND gates 310-1 to 310-8. Each of the AND gates 310-1 to 310-8 receives a respective pair of the LO phase signals I to Qb45, and performs an AND operation on the respective pair of the LO phase signals I to Qb45 to generate a respective one of the LO phase signals I_12.5 to Qb45_12.5. In the example shown in FIG. 3, AND gate 310-1 generates I_12.5 by performing an AND operation on Qb45 and I, AND gate 310-2 generates I45_12.5 by performing an AND operation on I and I45, AND gate 310-3 generates Q_12.5 by performing an AND operation on I45 and Q, and so forth. It is to be appreciated that the duty cycle generator 140 is not limited to the example of AND gates, and may be implemented using other types of logic gates such as NAND gates.

Figure 4:
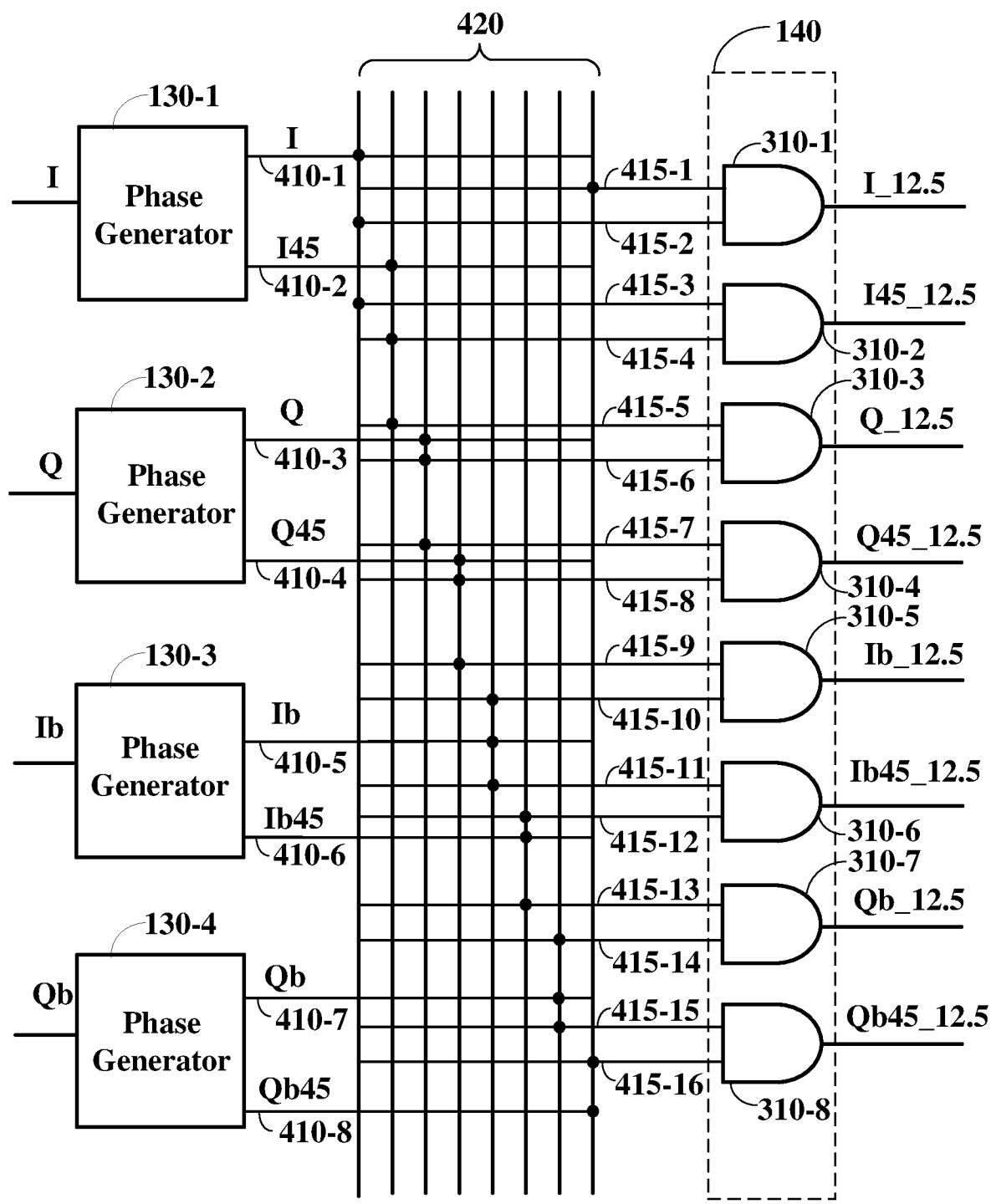
FIG. 4 shows an example of a mesh routing structure for routing signals to a duty cycle generator according to certain aspects of the present disclosure.

FIG. 4 shows an example of a mesh routing structure between the phase generators 130-1 to 130-4 and the duty cycle generator 140. In this example, the mesh routing structure includes multiple parallel routing lines 420 (e.g., metal lines). Each output of the phase generators 130-1 to 130-4 is coupled to one of the routing lines 420 via a respective output line 410-1 to 410-8, and each input of the AND gates 310-1 to 310-8 is coupled to one of the routing lines 420 via a respective input line 415-1 to 415-16.

Each output line 410-1 to 410-8 is coupled to the respective routing line 420 at a respective tap point (shown as a solid circle in FIG. 4). In one example, the output lines 410-1 to 410-8 are formed from a different metal layer than the routing lines 420, and each output line 410-1 to 410-8 is coupled to the respective routing line 420 at the respective tap point by a respective via or another interconnect structure. Each input line 415-1 to 415-16 is coupled to the respective routing line 420 at a respective tap point (shown as a solid circle in FIG. 4). In one example, the input lines 415-1 to 415-16 are formed from a different metal layer than the routing lines 420, and each input line 415-1 to 416-16 is coupled to the respective routing line 420 at the respective tap point by a respective via or another interconnect structure.

The routing lines 420 run perpendicular to the output lines 410-1 to 410-8 and the input lines 415-1 to 415-16, as shown in FIG. 4. Each of the routing lines 420 is coupled to one of the output lines 410-1 to 410-8 and two of the input lines 415-1 to 415-16. Thus, each of the routing lines 420 routes the LO phase signal (i.e., respective one of LO phase signals I to Qb45) from the respective output line to the two respective input lines.

Figure 5:
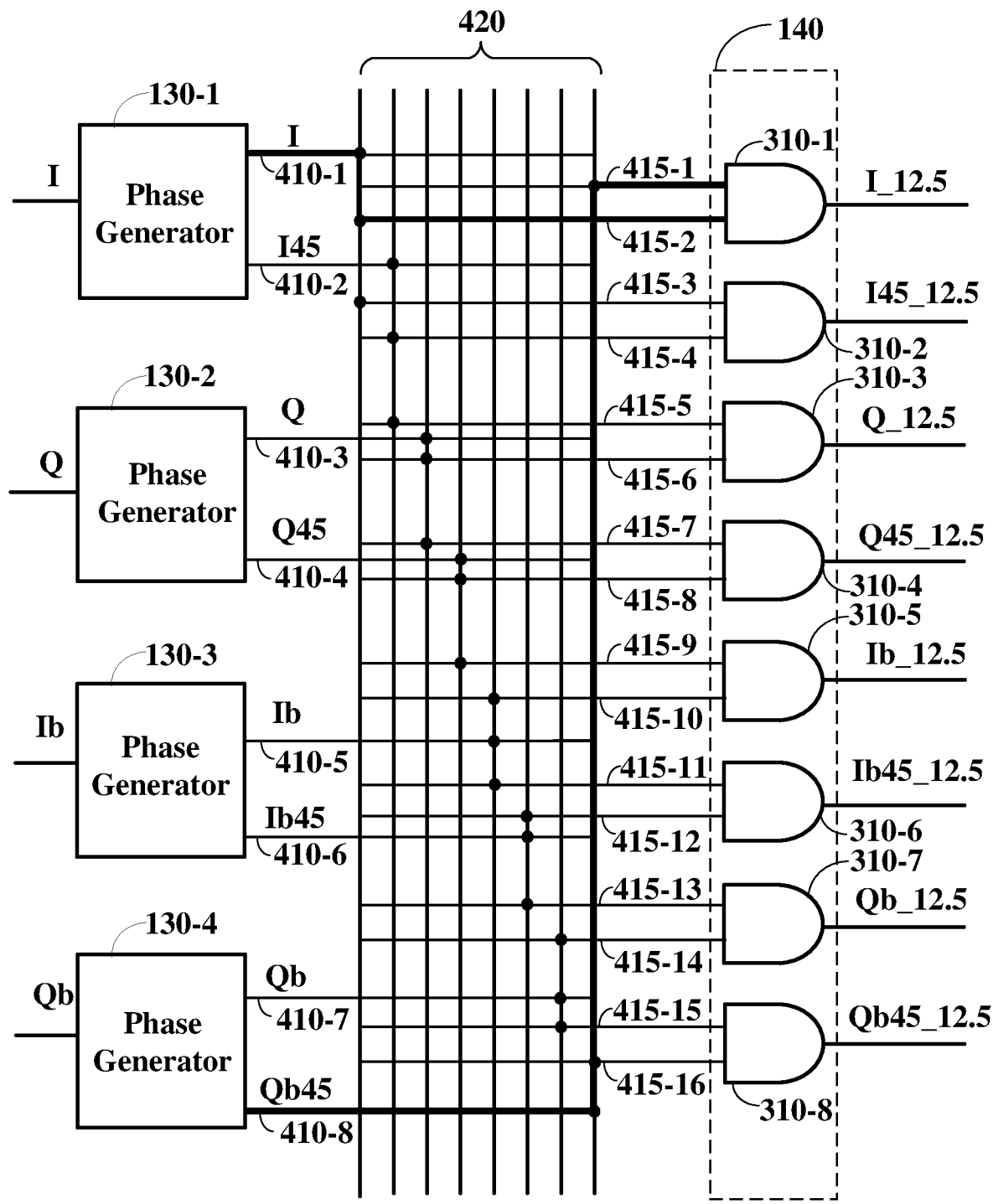
FIG. 5 shows an example of routing length mismatches in a mesh routing structure according to certain aspects of the present disclosure.

The mesh routing structure shown in FIG. 4 has several drawbacks. One drawback is that the mesh routing structure consumes a large chip area. This is because the routing lines 420 take up a large area, as can been seen from FIG. 4. Another drawback is that the mesh routing structure suffers from routing length mismatches. For example, the routing length for LO phase signal Qb45 from phase generator 130-4 to AND gate 310-1 is significantly longer than the routing length for LO phase signal I from phase generator 130-1 to AND gate 310-1. This is illustrated in FIG. 5, in which the signal path for LO phase signal Qb45 from phase generator 130-4 to AND gate 310-1 is thickened and the signal path for LO phase signal I from phase generator 130-1 to AND gate 310-1 is thickened. The routing length mismatches result in parasitic resistance mismatches and parasitic capacitance mismatches between the phase generators 130-1 to 130-4 and the AND gates 310-1 to 310-8, which degrades phase noise. The parasitic resistance mismatches generally cannot be reduced. The parasitic capacitance mismatches can be reduced by strategically adding dummy routing lines to the mesh routing structure. However, the dummy routing lines increase the area of the mesh routing structure and increase capacitive loading, which increases power consumption.

Also, routing length mismatches between the phase generators 130-1 to 130-4 and the AND gates 310-1 to 310-8 make it difficult to maintain the proper phase relationship between the LO phase signals I to Qb45 at the inputs of the AND gates 310-1 to 310-8.

Figure 6A:
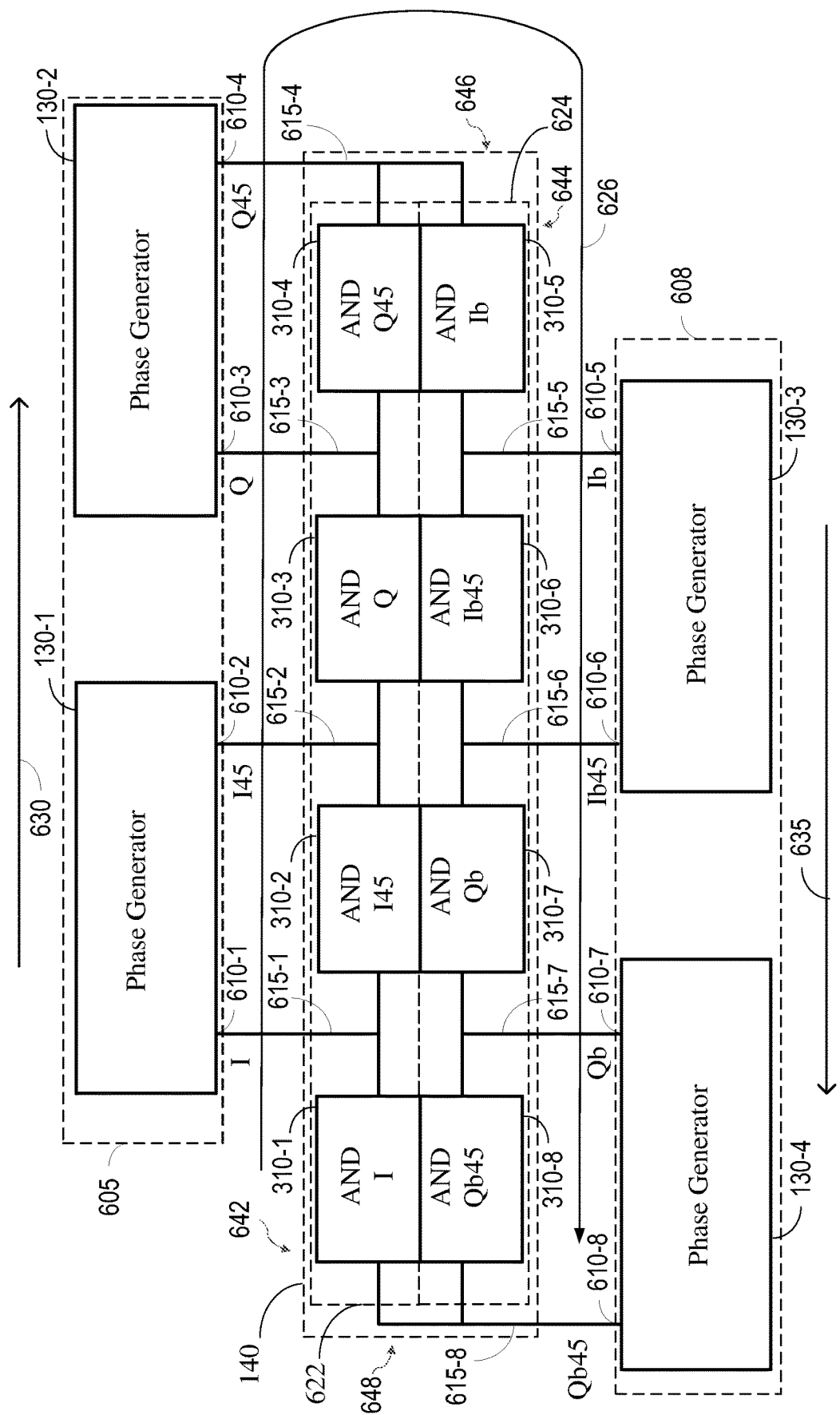
FIG. 6A shows an example of a layout for phase generators and a duty cycle generator according to certain aspects of the present disclosure.

FIG. 6A shows a top view of an exemplary layout for the phase generators 130-1 to 130-4 and the duty cycle generator 140 according to aspects of the present disclosure. In this example, the phase generators 130-1 to 130-4 are divided into a first set of phase generators 605 and a second set of phase generators 608, in which the first set of phase generators 605 includes phase generators 130-1 and 130-2 and the second set of phase generators 608 includes phase generators 130-3 and 130-4. The first set of phase generators 605 and the second set of phase generators 608 are located on opposite sides 642 and 644 of the duty cycle generator 140. In the example in FIG. 6A, the first set of phase generators 605 is located adjacent to side 642 of the duty cycle generator 140, and the second set of phase generators 608 is located adjacent to side 644 of the duty cycle generator 140, in which sides 642 and 644 are opposite sides of the duty cycle generator 140.

The AND gates 310-1 to 310-8 are divided into a first set of AND gates 622 and a second set of AND gates 624, in which the first set of AND gates 622 includes AND gates 310-1 to 310-4 and the second set of AND gates 624 includes AND gates 310-5 to 310-8. In the example in FIG. 6A, the AND gates 310-1 to 310-4 in the first set 622 are arranged in a first row adjacent to the first set of phase generators 605, and the AND gates 310-5 to 310-8 in the second set 624 are arranged in a second row adjacent to the second set of phase generators 608.

The layout also includes output lines 615-1 to 615-8 coupling the outputs 610-1 to 610-8 of the phase generators 130-1 to 130-4 to the corresponding inputs of the AND gates 310-1 to 310-8. The output lines 615-1 to 615-8 may be implemented with metal lines on the die. The outputs 610-1 to 610-8 of the phase generators 130-1 to 130-4 for the LO phase signals I to Qb45 are arranged in a circular fashion (indicated by loop arrow 626). In the example in FIG. 6A, the LO phase signals I to Qb45 are divided into a first set of LO phase signals I to Q45 and a second set of LO phase signal Ib to Qb45, and the outputs 610-1 to 610-8 are divided into a first set of outputs 610-1 to 610-4 corresponding to the first set of LO phase signals I to Q45 and a second set of outputs 610-5 to 610-8 corresponding to the second set of LO phase signals Ib to Qb45. The first set of LO phase signals I to Q45 is output at the first set of outputs 610-1 to 610-4 in order of increasing phase in a first lateral direction (indicated by arrow 630). The second set of LO phase signals Ib to Qb45 is output at the second set of outputs 610-5 to 610-8 in order of increasing phase in a second lateral direction (indicated by arrow 635), in which the first lateral direction 630 and the second lateral direction 635 are opposite directions, as shown in FIG. 6A. As used herein, the term "lateral" refers to a direction that runs parallel to the substrate of the die.

The exemplary layout in FIG. 6A allows the distance between the output 610-8 for LO phase signal Qb45 and AND gate 310-1 to be more closely matched with the distance between the output 610-1 for LO phase signal I and AND gate 310-1 compared with the mesh routing structure in FIG. 5. As a result, the routing length for LO phase signal Qb45 from phase generator 130-4 to AND gate 310-1 is more closely matched with the routing length for LO phase signal I from phase generator 130-1 to AND gate 310-1. In contrast, in the mesh routing structure shown in FIG. 5, the routing length for LO phase signal Qb45 from phase generator 130-4 to AND gate 310-1 is significantly longer than the routing length for LO phase signal I from phase generator 130-1 to AND gate 310-1, resulting in a large routing length mismatch for the inputs of AND gate 310-1.

Thus, the exemplary layout shown in FIG. 6A provides for more closely matched routing lengths between the phase generators 130-1 to 130-4 and the duty cycle generator 140. As a result, the parasitic resistances and the parasitic capacitances of the signal paths between the phase generators 130-1 to 130-4 and the AND gates 310-1 to 130-8 can be more closely matched, which improves phase noise performance. In addition, total routing length is reduced and the chip area consumed by the signal routing between the phase generators 130-1 to 130-4 and the duty cycle generator 140 is reduced compared with the mesh routing structure shown in FIG. 4.

Note that there is a small mismatch between the length of the signal routing from phase generator 130-2 to AND 310-4 and the length of the signal routing from phase generator 130-2 to AND gate 310-5. Similarly, there is a small mismatch between the length of the signal routing from phase generator 130-4 to AND 310-1 and the length of the signal routing from phase generator 130-4 to AND gate 310-8. However, these length mismatches are significantly smaller than the mismatch between the length of the signal routing from phase generator 130-4 to AND gate 310-1 and the length of the signal routing from phase generator 130-1 to AND gate 310-1 shown in FIG. 5.

For the example in which the phase generators 130-1 to 130-4 are implemented using the exemplary implementation shown in FIG. 2, the outputs 610-1, 610-3, 610-5 and 610-7 in FIG. 6A correspond to the outputs 220-1, 220-2, 220-3 and 220-4, respectively, in FIG. 2, and the outputs 610-2, 610-4, 610-6 and 610-8 in FIG. 6A correspond to the outputs 222-1, 222-2, 222-3 and 222-4, respectively, in FIG. 2.

FIG. 6A does not explicitly show the output signal routing from the outputs of the AND gates 310-1 to 310-8 to the multiphase HRM 145 for ease of illustration. An example of output signal routing from the duty cycle generator 140 to the multiphase HRM 145 is shown in FIG. 1. As discussed above, the length of the signal routing from the duty cycle generator 140 to the multiphase HRM 145 for each of the LO phase signals I_12.5 to Qb45_12.5 may be approximately the same to preserve the phase relationships between the LO phase signals I_12.5 to Qb45_12.5 at the multiphase HRM 145.

It is to be appreciated that the present disclosure is not limited to placing phase generators 130-1 to 130-4 on only the opposite sides 642 and 644 of the duty cycle generator 140, as shown in the example in FIG. 6A. For example, phase generators may also be placed on all four sides 642, 644, 646 and 648 of the duty cycle generator 140, in which the four sides 642, 644, 646 and 648 include the opposite sides 642 and 644 of the duty cycle generator 140 discussed above.

Although aspects of the present disclosure are discussed above using the example of eight LO phases with a duty cycle of 12.5%, it is to be appreciated that the present disclosure is not limited to this example. For example, the exemplary layout shown in FIG. 6A may be used to provide signal routing for a duty cycle generator that generates a different number of LO phase signals with a different duty cycle (e.g., four LO phase signals with a duty cycle of 25% for a four-phase HRM 145, 12 LO phase signals with a duty cycle of 8.33% for a 12-phase HRM 145, etc.).

In the example in FIG. 6A, the duty cycle generator converts the duty cycle of each of the LO phase signals I to Qb45 to a duty cycle of 12.5%. However, it is to be appreciated that the present disclosure is not limited to this example. For example, the duty cycle generator 140 may convert the duty cycle of each of 4 LO phase signals to a duty cycle of 25% for a four-phase HRM 145, convert the duty cycle of each of 12 LO phase signals to a duty cycle of approximately 8.33% for a 12-phase HRM 145, etc. In general, the duty cycle generator 140 is configured to convert the duty cycle of each of multiple LO phase signals from a first duty cycle to a second duty cycle, in which the first duty cycle and the second duty cycle are different. In the example in FIG. 6A, the second duty cycle is approximately 12.5%.

Figure 6B:
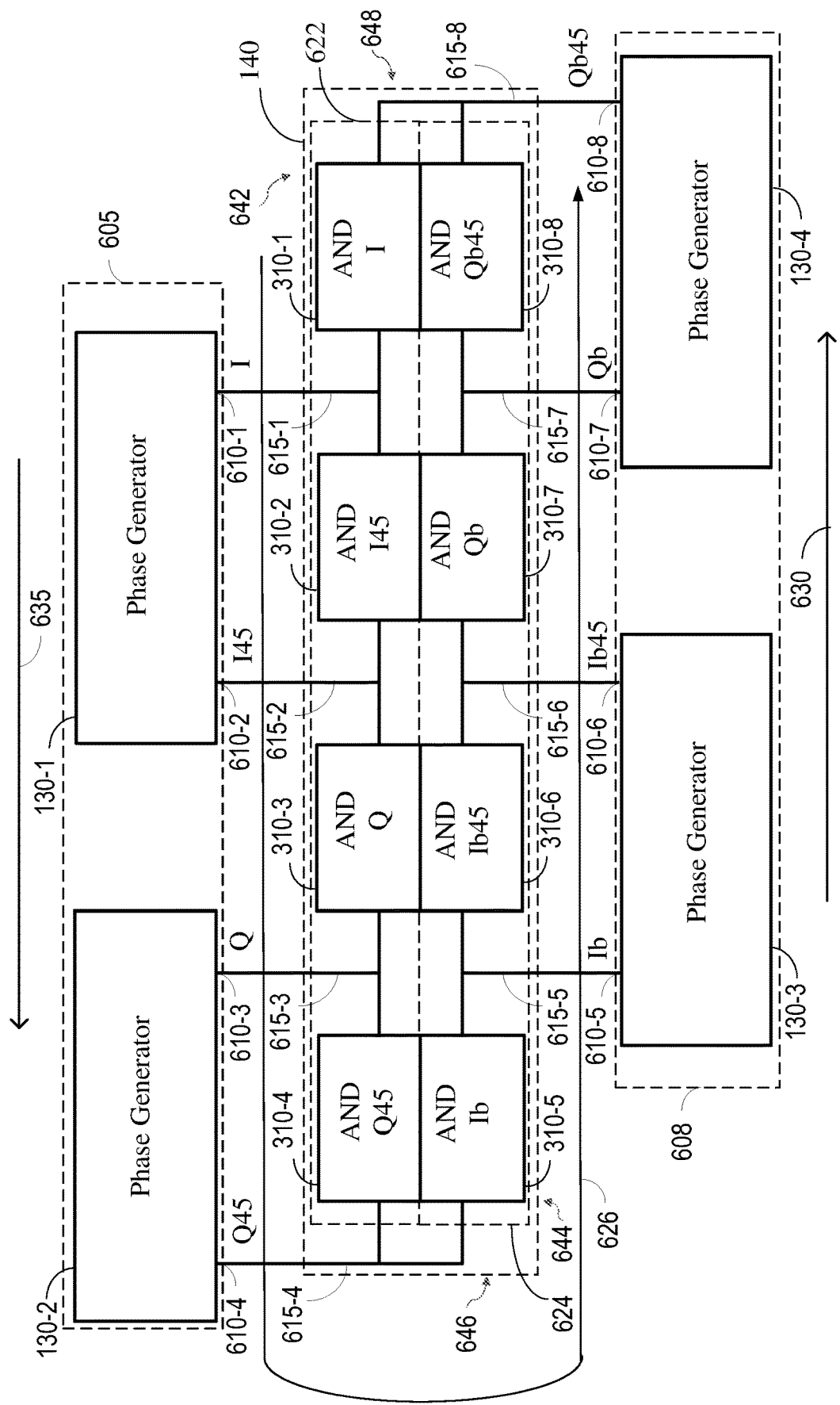
FIG. 6B shows another example of a layout for phase generators and a duty cycle generator according to certain aspects of the present disclosure.

It is to be appreciated that the exemplary layout shown in FIG. 6A may be flipped horizontally. In this regard, FIG. 6B shows an example in which the exemplary layout in FIG. 6A is flipped horizontally. Note that, in the example in FIG. 6B, flipping the layout in FIG. 6A horizontally does not affect the lengths of the signal routing from the phase generators 130-1 to 130-4 to the duty cycle generator 140. The exemplary layout shown in FIG. 6A may also be flipped vertically. Thus, it is to be appreciated that the present disclosure is not limited to the exemplary orientation shown in FIG. 6A.

Figure 7:
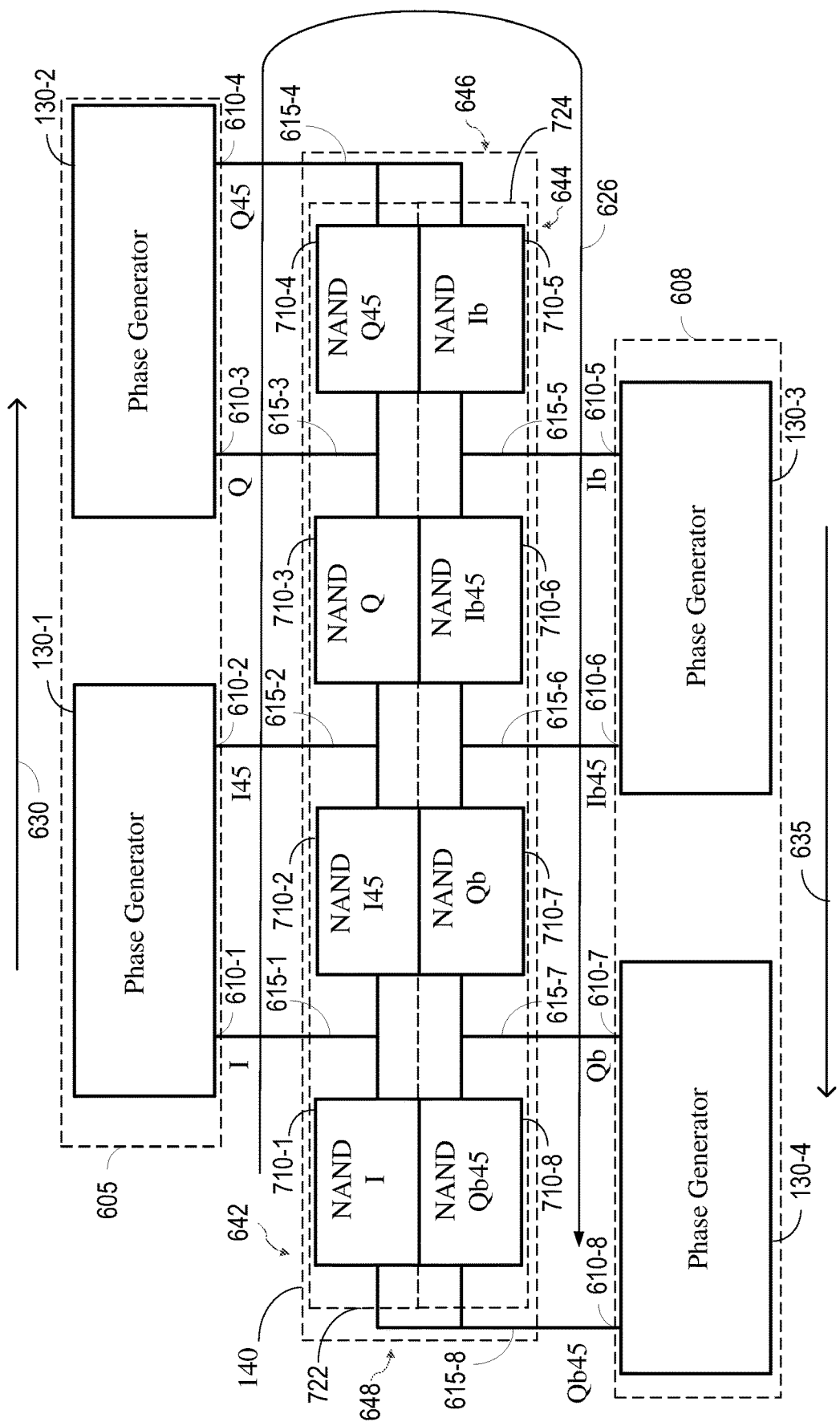
FIG. 7 shows an example of a duty cycle generator including NAND gates according to certain aspects of the present disclosure.

Although the duty cycle generator 140 is implemented with AND gates in the example in FIG. 6A, it is to be appreciated that the present disclosure is not limited to this example and that the duty cycle generator 140 may be implemented with other types of logic gates (e.g., NAND gates). For example, FIG. 7 shows an example in which the AND gates 610-1 to 610-8 are replaced with NAND gates 710-1 to 710-8, respectively. In this example, the output signals of the NAND gates 710-1 to 710-8 are the inverse of the output signals of the AND gates 610-1 to 610-8 (i.e., the inverse of the LO phase signals I_12.5 to Qb45_12.5 in FIG. 4). In one example, the output signals of the NAND gates 710-1 to 710-8 may be inverted (e.g., using inverters) to obtain the LO phase signals I_12.5 to Qb45_12.5 in FIG. 4. In another example, the multiphase HRM 145 may be configured to perform mixing operations using the inverse LO phase signals I_12.5 to Qb45_12.5 output by the NAND gates 710-1 to 710-8. The NAND gates 710-1 to 710-8 may be used, for example, for semiconductor technologies in which NAND gates are easier to implement than AND gates.

In the example in FIG. 7, each of the NAND gates 710-1 to 710-8 receives a respective pair of the LO phase signals I to Qb45, and performs a NAND operation on the respective pair of the LO phase signals I to Qb45 to generate a respective one of the inverse LO phase signals I_12.5 to Qb45_12.5. Also, the NAND gates 710-1 to 710-8 are divided into a first set of NAND gates 722 and a second set of NAND gates 724, in which the first set of NAND gates 722 includes NAND gates 710-1 to 710-4 and the second set of NAND gates 724 includes NAND gates 710-5 to 710-8. In the example in FIG. 7, the NAND gates 710-1 to 710-4 in the first set 722 are arranged in a first row adjacent to the first set of phase generators 605, and the NAND gates 710-5 to 710-8 in the second set 724 are arranged in a second row adjacent to the second set of phase generators 608.

Figure 8:
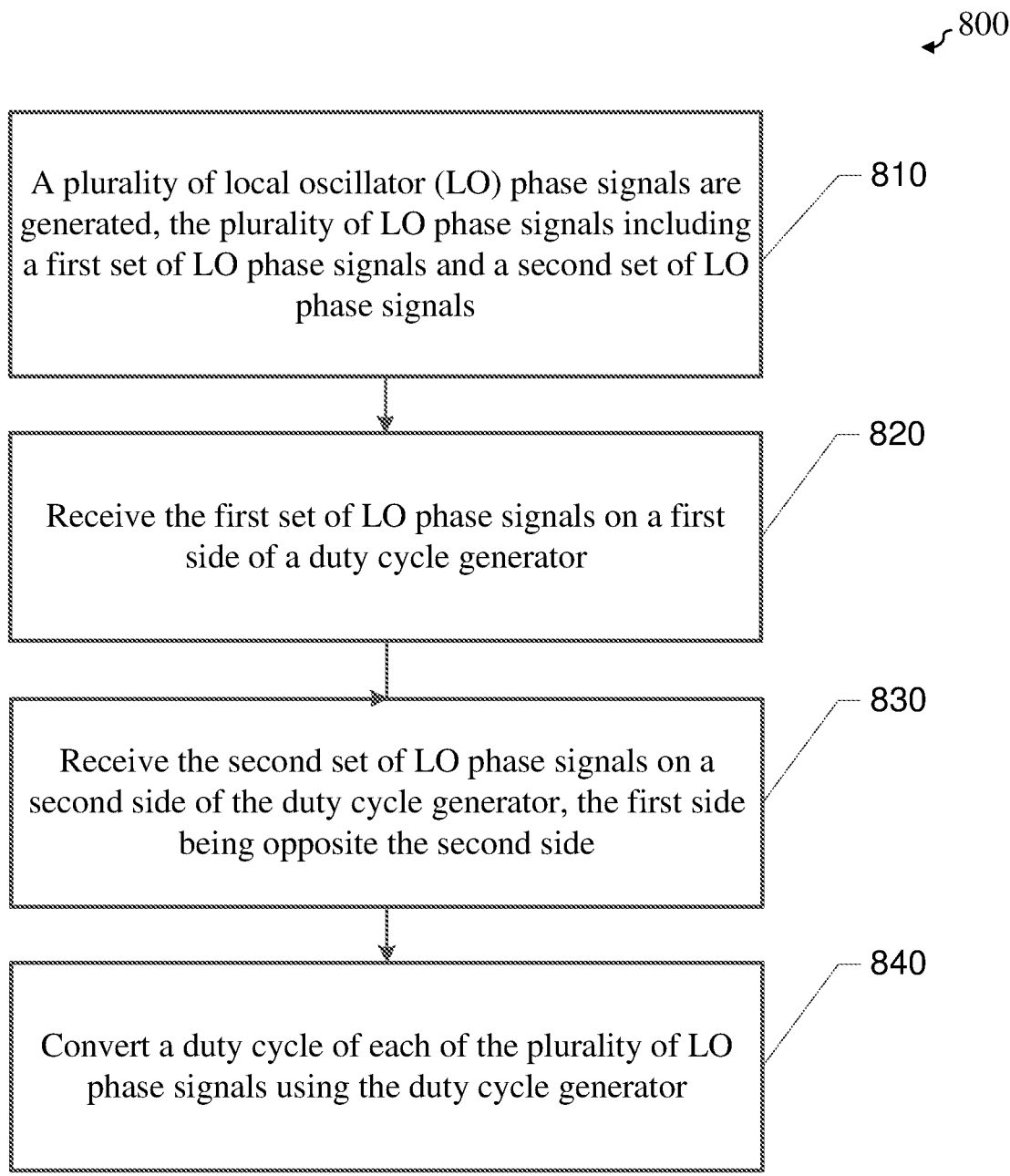
FIG. 8 is a flow diagram illustrating a method for multiphase local oscillation according to certain aspects of the present disclosure.

FIG. 8 illustrates a method 800 for multiphase local oscillation according to certain aspects of the present disclosure. The method 800 may be performed by the phase generators 130-1 to 130-4 and the duty cycle generator 140.

At block 810, a plurality of local oscillator (LO) phase signals are generated, the plurality of LO signals including a first set of LO phase signals and a second set of LO phase signals. An example of the plurality of LO phase signals may include LO phase signals I to Qb45, in which the first set of LO phase signals includes LO phase signals I, I45, Q and Q45, and the second set of LO phase signals includes LO phase signals Ib, Ib45, Qb and Qb45.

At block 820, the first set of LO phase signals is received on a first side of a duty cycle generator. An example of the duty cycle generator is duty cycle generator 140, and an example of the first side of the duty cycle generator is side 642 of the duty cycle generator 140.

At block 830, the second set of LO phase signals is received on a second side of the duty cycle generator, the second side being opposite the first side. An example of the second side of the duty cycle generator is side 644 of the duty cycle generator 140.

At block 840, a duty cycle of each of the plurality of LO phase signals is converted using the duty cycle generator. For example, the duty cycle of each of the plurality of LO phase signals may be converted to a duty cycle of 12.5% (e.g., for an 8-phase HRM) or another duty cycle.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. The term "approximately" is used herein to mean within 10% of the stated value.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
   a plurality of phase generators configured to generate a first plurality of local oscillator (LO) phase signals, wherein the plurality of phase generators includes a first set of phase generators and a second set of phase generators; and
   a duty cycle generator coupled to the plurality of phase generators, wherein the duty cycle generator is configured to:
      receive the first plurality of LO phase signals; and
      generate a second plurality of LO phase signals by converting a duty cycle of each of the first plurality of LO phase signals;
   wherein the first set of phase generators is located adjacent to a first side of the duty cycle generator and the second set of phase generators is located adjacent to a second side of the duty cycle generator, the second side being opposite the first side.

2. The apparatus of claim 1, wherein the first plurality of LO phase signals are spaced apart from each other approximately 45 degrees in phase.

3. The apparatus of claim 1, wherein the duty cycle generator is configured to convert the duty cycle of each of the first plurality of LO phase signals to a duty cycle of approximately 12.5%.

4. The apparatus of claim 3, wherein the second plurality of LO phase signals are spaced apart from each other approximately 45 degrees in phase.

5. The apparatus of claim 1, wherein:
the duty cycle generator comprises a plurality of AND gates; and
each of the plurality of AND gates is configured to:
receive a respective pair of LO phase signals in the first plurality of LO phase signals; and
perform an AND operation on the respective pair of LO phase signals to generate a respective one of the second plurality of LO phase signals.

6. The apparatus of claim 5, wherein:
the plurality of AND gates includes a first set of AND gates and a second set of AND gates;
the first set of AND gates are arranged in a first row adjacent to the first set of phase generators; and
the second set of AND gates are arranged in a second row adjacent to the second set of phase generators.

7. The apparatus of claim 1, wherein:
the duty cycle generator comprises a plurality of NAND gates; and
each of the plurality of NAND gates is configured to:
receive a respective pair of LO phase signals in the first plurality of LO phase signals; and
perform a NAND operation on the respective pair of LO phase signals to generate a respective one of the second plurality of LO phase signals.

8. The apparatus of claim 7, wherein:
the plurality of NAND gates includes a first set of NAND gates and a second set of NAND gates;
the first set of NAND gates are arranged in a first row adjacent to the first set of phase generators; and
the second set of NAND gates are arranged in a second row adjacent to the second set of phase generators.

9. The apparatus of claim 1, wherein:
the first plurality of LO phase signals includes a first set of LO phase signals and a second set of LO phase signals;
the first set of phase generators is configured to output the first set of LO phase signals at a first set of outputs in order of increasing phase in a first lateral direction;
the second set of phase generators is configured to output the second set of LO phase signals at a second set of outputs in order of increasing phase in a second lateral direction; and
the first lateral direction is opposite the second lateral direction.

10. The apparatus of claim 9, wherein the first plurality of LO phase signals are spaced apart from each other approximately 45 degrees in phase.

11. The apparatus of claim 1, further comprising a multiphase mixer coupled to the duty cycle generator, wherein the multiphase mixer is configured to mix the second plurality of LO phase signals with an input signal to translate a frequency of the input signal.

12. The apparatus of claim 11, wherein the first plurality of LO phase signals are spaced apart from each other approximately 45 degrees in phase.

13. The apparatus of claim 12, wherein the duty cycle generator is configured to convert the duty cycle of each of the first plurality of LO phase signals to a duty cycle of approximately 12.5%.

14. The apparatus of claim 1, wherein each of the plurality of phase generators comprises:
a first signal path coupled between an input of the phase generator and a first output of the phase generator; and
a second signal path coupled between the input of the phase generator and a second output of the phase generator, wherein the second signal path includes a delay element.

15. The apparatus of claim 14, wherein, in each of the plurality of phase generators, the respective delay element provides a time delay approximately equal to one-eighth of a cycle of a respective one of the first plurality of LO phase signals.

16. An apparatus for multiphase local oscillation, comprising:
means for generating a plurality of local oscillator (LO) phase signals, the plurality of LO signals including a first set of LO phase signals and a second set of LO phase signals; and
means for converting a duty cycle of each of the plurality of LO phase signals;
wherein the means for converting is configured to receive the first set of LO phase signals on a first side of the means for converting, and is configured to receive the second set of LO phase signals on a second side of the means for converting, the second side being opposite the first side.

17. The apparatus of claim 16, wherein:
the means for converting is configured to receive the first set of LO phase signals in order of increasing phase in a first lateral direction;
the means for converting is configured to receive the second set of LO phase signals in order of increasing phase in a second lateral direction; and
the first lateral direction is opposite the second lateral direction.

18. The apparatus of claim 16, wherein the plurality of LO phase signals are spaced apart from each other approximately 45 degrees in phase.

19. The apparatus of claim 16, wherein the means for converting is configured to convert the duty cycle of each of the plurality of LO phase signals to a duty cycle of approximately 12.5%.

20. A method for multiphase local oscillation, comprising:
generating a plurality of local oscillator (LO) phase signals, the plurality of LO signals including a first set of LO phase signals and a second set of LO phase signals;
receiving the first set of LO phase signals on a first side of a duty cycle generator;
receiving the second set of LO phase signals on a second side of the duty cycle generator, the second side being opposite the first side; and
converting a duty cycle of each of the plurality of LO phase signals using the duty cycle generator.

21. The method of claim 20, wherein:
receiving the first set of LO phase signals comprises receiving the first set of LO phase signals in order of increasing phase in a first lateral direction;
receiving the second set of LO phase signals comprises receiving the second set of LO phase signals in order of increasing phase in a second lateral direction;
the first lateral direction is opposite the second lateral direction.

22. The method of claim 20, wherein the plurality of LO phase signals are spaced apart from each other approximately 45 degrees in phase.

23. The method of claim 20, wherein converting the duty cycle of each of the plurality of LO phase signals comprises converting the duty cycle of each of the plurality of LO phase signals to a duty cycle of approximately 12.5%.

* * * * *